United States Patent

Schuster

[11] Patent Number: 5,818,101
[45] Date of Patent: Oct. 6, 1998

[54] ARRANGEMENT FOR THE PROTECTION OF ELECTRICAL AND ELECTRONIC COMPONENTS AGAINST ELECTROSTATIC DISCHARGE

[75] Inventor: Alfred Schuster, Grossmehring, Germany

[73] Assignee: Temic Telefunken microelectronic GmbH, Heilbronn, Germany

[21] Appl. No.: 767,030

[22] Filed: Dec. 12, 1996

[30] Foreign Application Priority Data

Jan. 18, 1996 [DE] Germany ............... 196 01 650.9

[51] Int. Cl.⁶ ........................................... H01L 23/552
[52] U.S. Cl. .................. 257/659; 257/665; 257/691; 361/794; 361/799; 361/820
[58] Field of Search ........................... 257/659, 664, 257/665, 691; 361/794, 799, 800, 820

[56] References Cited

U.S. PATENT DOCUMENTS

| | | | |
|---|---|---|---|
| 3,725,745 | 4/1973 | Zisa | 317/104 |
| 4,322,777 | 3/1982 | Ueta et al. | . |
| 4,586,105 | 4/1986 | Lippmann et al. | 361/117 |
| 4,617,586 | 10/1986 | Cuvilliers et al. | 257/665 |
| 4,617,605 | 10/1986 | Obrecht et al. | . |
| 4,725,923 | 2/1988 | Mylne, III | 361/395 |
| 4,766,481 | 8/1988 | Gobrecht et al. | 257/664 |
| 5,235,208 | 8/1993 | Katoh | 257/691 |
| 5,291,065 | 3/1994 | Arai et al. | 257/691 |
| 5,383,097 | 1/1995 | DeLucia et al. | . |
| 5,444,297 | 8/1995 | Oshima et al. | 257/691 |
| 5,488,256 | 1/1996 | Tsunoda | 257/691 |

FOREIGN PATENT DOCUMENTS

| | | |
|---|---|---|
| 3322679 | 1/1985 | Germany . |
| 4232575 | 3/1994 | Germany . |
| 4329251 | 3/1995 | Germany . |
| 29520176 | 5/1996 | Germany . |
| 2247109 | 2/1992 | United Kingdom . |

OTHER PUBLICATIONS

Shin'ichiro Asai et al.: "Fabircation of an Insulated Metal Substrate (IMS), Having an Insulated . . . ". In: IEEE Transactions on Components, Hybrids and Manufacturing Technology, vol. 16, No. 5, Aug. 93, pp. 499–504.

*Primary Examiner*—David Ostrowski
*Attorney, Agent, or Firm*—Spencer & Frank

[57] ABSTRACT

Arrangement for the protection of electrical and electronic components against electrostatic discharge, where a printed circuit board on which the components are mounted is physically connected to a metal plate via an insulating layer with the insulating layer having at least one conductor track of the printed circuit board opening over which at least one track is placed to form a first spark gap between the track and the metal plate and with the metal plate being connected to a fixed potential.

12 Claims, 2 Drawing Sheets

ARRANGEMENT FOR THE PROTECTION OF ELECTRICAL AND ELECTRONIC COMPONENTS AGAINST ELECTROSTATIC DISCHARGE

BACKGROUND OF THE INVENTION

The invention relates to an arrangement for the protection of electrical and electronic components against electrostatic discharge (ESD), where a printed circuit board on which the components are mounted is physically connected to a metal plate via an insulating layer.

In the automotive industry in particular, great demands are imposed on electrical and electronic units with regard to the capacity for withstanding electrostatic discharge. Accordingly, the design of a unit of this kind should include protective measures that cause electrostatic discharge originating in most cases from an external source to be conducted away or to be rendered harmless by other means in order to protect sensitive components from being damaged by electrostatic discharge.

The module connector/connectors represent the main and critical point of entry for ESD pulses in electrical or electronic modules because ESD pulses are transmitted through it/them directly to the circuit. The module housings, however, do not as a rule represent a problem with respect to ESD protection. They are often made of plastic or metal so that an electrical charge introduced by ESD is not transmitted to the circuit or it is conducted away in such a manner that no damage is caused.

In state-of-the-art applications, capacitors known as blocking capacitors are mainly used to protect against the effects of ESD. These take up the electrical charge and thus limit the voltage in the line concerned to an uncritical value.

It is disadvantageous here that one capacitor must be provided for each connector pin used solely for the purpose of providing protection against ESD. This is costly and takes up space on the printed circuit board.

SUMMARY OF THE INVENTION

The object of the invention is to provide an arrangement that offers protection against electrostatic discharge and requires no capacitors.

According to the invention there is an arrangement for the protection of electrical and electronic components against electrostatic discharge, where a printed circuit board on which the components are mounted is physically connected to a metal plate via an insulating layer, wherein the insulating layer has at least one opening and wherein at least one conductive track is positioned above this opening to form a first spark gap between the conductive in the circuit board track and the metal plate, and wherein the metal plate is connected to a fixed potential.

Advantageous types of embodiment of the invention are described in the Subclaims.

The advantages of the invention are in particular that, apart from the saving of space on the printed circuit board and of material costs for capacitors, the arrangement for the protection against electrostatic discharge can be placed anywhere on the printed circuit board. By using air as the conductive medium, any number of discharges can still occur without, for instance, the feared effect of carbonization taking place in plastics that causes the material concerned to at least become conductive with a high resistance value. Furthermore, the introduction of slots in the insulating layer does not result in additional costs.

BRIEF DESCRIPTION OF THE DRAWINGS

One embodiment example of the invention will now be described in more detail on the basis of the drawings.

DESCRIPTION OF THE PREFERRED EMBODIMENTS

Figure 1:
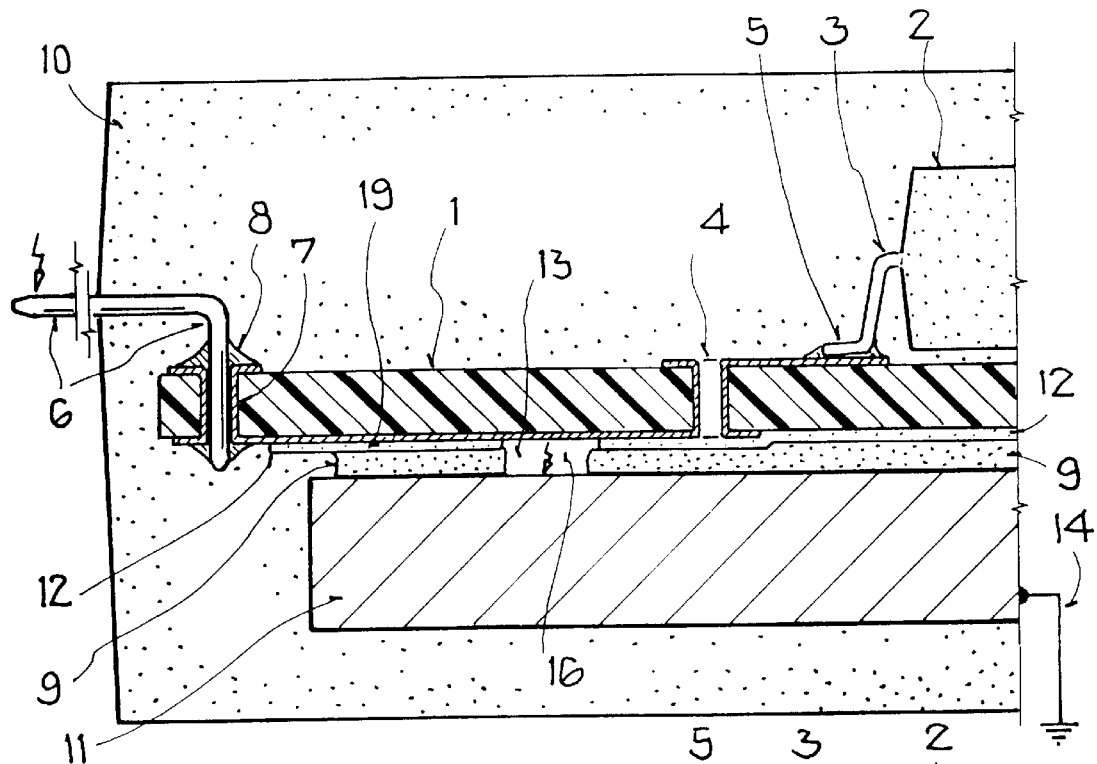
FIG. 1 illustrates a first embodiment of the arrangement according to the invention for the protection of a circuit board against ESD
Figure 2:
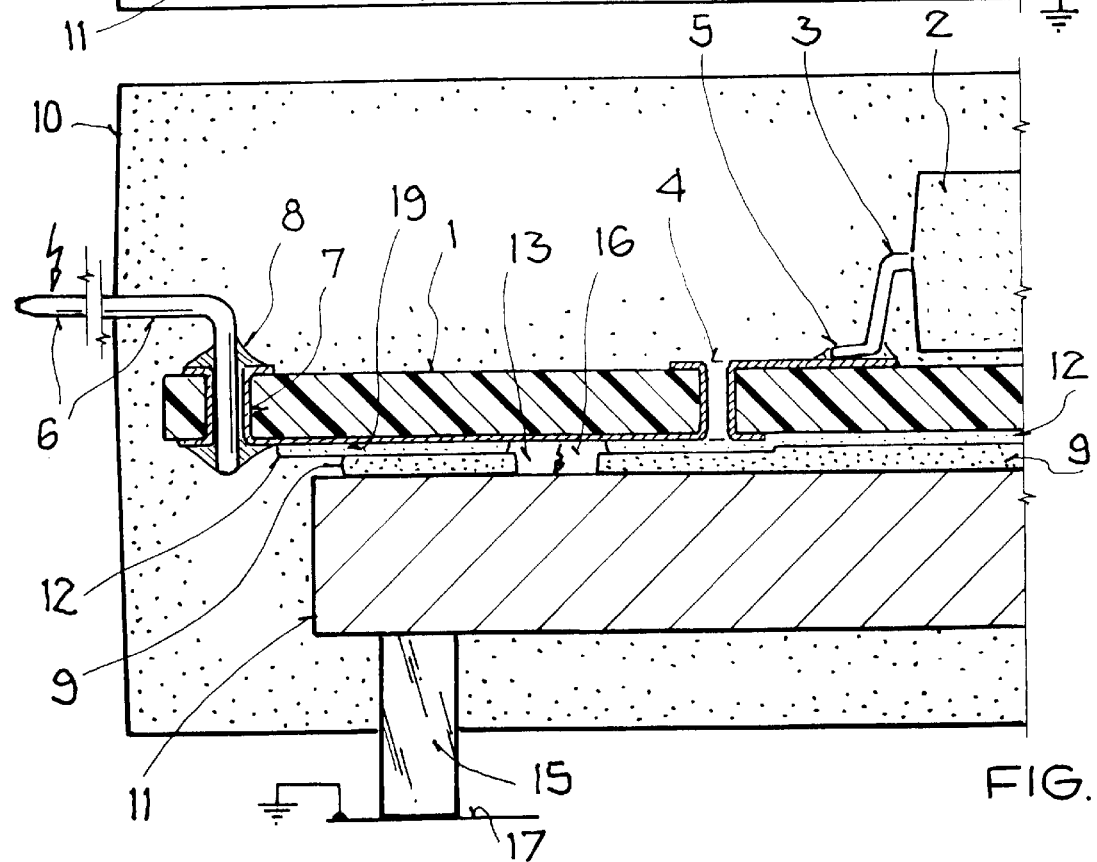
FIG. 2 shows a variant of the embodiment shown in FIG. 1
Figure 4:
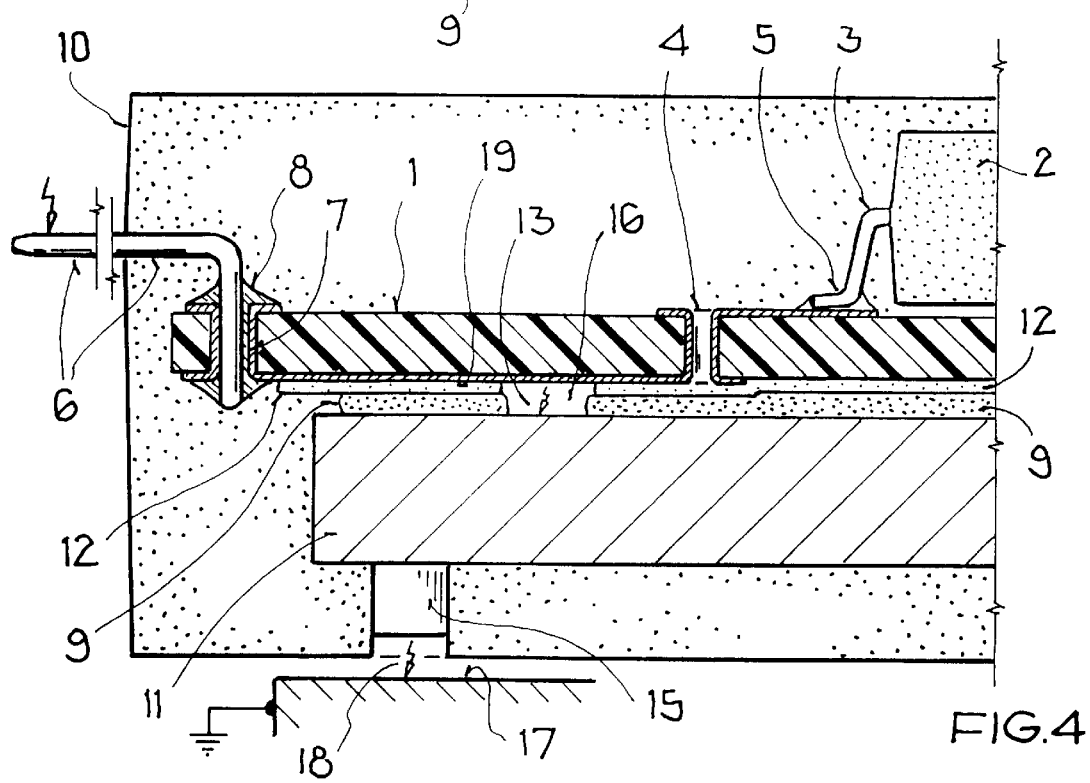
FIG. 4 illustrates a further variant of the embodiment shown in FIG. 1.

FIGS. 1, 2 and 4 show a printed circuit board 1 in a housing 10 which is generally made of a plastic material. The printed circuit board 1 has components mounted on one side. On the upper side of the printed circuit board 1 there is a circuit arrangement comprising electrical and electronic components 2 with terminals 3 and on the lower side there are only conductive tracks strip conductors 19. Furthermore, soldering points 5 are provided for connecting the terminals 3 to the tracks 19 and plated-through connections 4 by means of which the conductive tracks 19 on the upper and lower sides of the printed circuit board 1 are connected together. Holes 7 are made in the printed circuit board 1 for connector pins 6 to form a plug connection, in such a way that the connector pins 6 can be inserted and, by means of a solder 8, connected mechanically to the printed circuit board 1 and electrically to the tracks 19. The reverse side of the printed circuit board 1 has a solder stop lacquer coating 12 and an insulating layer 9 and is pressed onto a metal plate 1 which is advantageously made of aluminum. In the pressing operation under increased temperature, the metal plate 11 is bonded to the printed circuit board 1, the insulating layer 9 also acting as bonding material. The insulating layer 9 is of small thickness in order to ensure maximum possible thermal conductivity between printed circuit board 1 and metal plate 11.

In accordance with the invention, the insulating layer 9 and the solder stop lacquer coating 12 between the lower side of the printed circuit board 1 and the metal plate 11 laminated on it have an opening 13 in the form of a slot that provides ESD protection.

In FIG. 1, the metal plate 11 is connected to the reference potential by means of an electrically conductive connection 14. It is also possible to connect it to the supply voltage of the circuit arrangement or to another fixed potential. It is important that the conductive track 19 to be protected on the lower side of the printed circuit board 1 is arranged over this opening 13.

The arrangement according to the invention for protecting against ESD pulses is based on the fact that the breakdown strength in air is very much lower than in solid insulating substances. When an electrostatic discharge occurs on the connector pin 6, an arc-over takes place across a spark gap 16 within the opening 13 from the track 19 to the metal plate 11 so that the voltage on the connector pin 6 and the track 19 is limited to 300 V for example, thereby protecting the components 2. The breakdown voltage is determined by the gap between metal plate 11 and track 19 and therefore largely by the thickness of the insulating layer 9.

Care must be taken to ensure that the slotted openings 13 are neither too narrow nor too wide. If they are too narrow, resin from the insulating layer 9 will flow during the pressing operation into the opening 13 and close both the opening and the spark gap 16 between metal plate 11 and printed circuit board 1. If the opening 13 is too wide, there is a risk of the printed circuit board 1 bending down in the opening 13 during the pressing operation to such an extent that a short circuit is created between conductive track 19 and metal plate 11.

The tracks 19 that are exposed on account of the opening 13 are hermetically enclosed from above by the printed circuit board 1, from below by the metal plate 11, and from all sides by the insulating layer 9, and thus protected against environmental influences such as moisture and dirt.

FIG. 2 shows a solution for ESD protection in such conceivable applications where the metal plate 11 cannot be connected directly to a fixed potential in the form shown in FIG. 1. A metal pin 15, for example, is injection-molded in the housing 10 for this purpose so that after assembly either an electrically conductive connection is established or again a spark gap between the metal pin 15 and a metal surface 17 which is at reference potential, such as the body of a vehicle.

Figure 3:
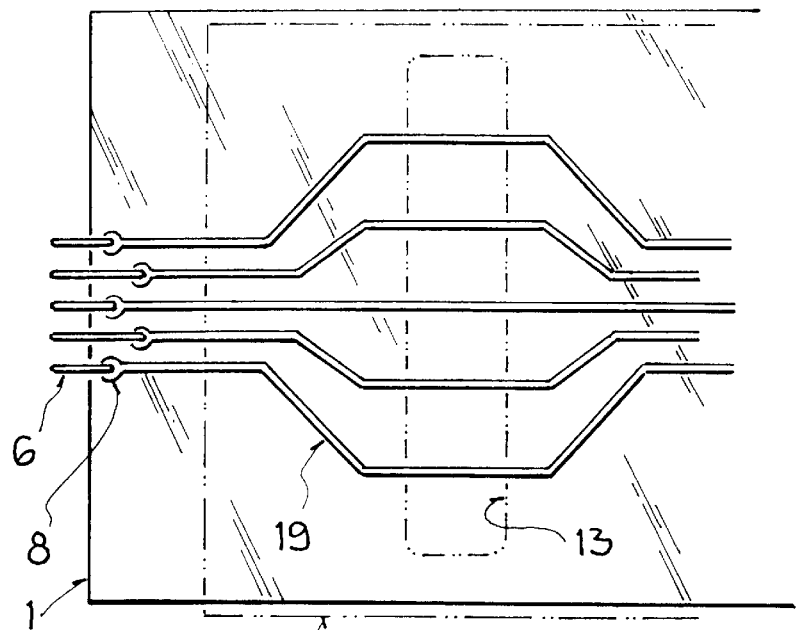
FIG. 3 is a detail view of the embodiments shown in FIGS. 1, 2 and 4

The detail view in FIG. 3 shows how the tracks 19 to be protected are preferably arranged in the region of the opening 13. In order to avoid surface arc-overs and leakage currents, the tracks 19 must be spaced away from each other in the region of the opening 13 by a distance which is at least four times as great as in the region away from the opening 13.

FIG. 4 shows another variant of the arrangement in FIG. 1. If in specific applications the metal plate 11 cannot be connected directly to a fixed potential such as the reference potential, the supply voltage or some other fixed potential, the metal pin 15 is arranged at a certain distance above a surface 17, which can be a part of the housing 10 or the body of a motor vehicle and which is at a fixed potential, such that a second spark gap 18 is provided. This second spark gap 18 ensures that the metal plate 11 is not electrically connected to a fixed potential and that nonetheless electrostatic discharges can be conducted away.

The arrangement according to the invention can be used to protect against ESD pulses especially in the field of planar technology where a printed circuit board has a cooling plate laminated on it.

What is claimed is:

1. Arrangement for the protection of electrical and electronic components against electrostatic discharge, wherein a printed circuit board on which the components are mounted is physically connected to a metal plate via an insulating layer, wherein the insulating layer has at least one opening, and wherein at least one conductive track, which is connected to at least one of the components, is on a surface of the printed circuit board facing the metal plate and extends over this opening to form a first spark gap within the opening and directly between the at least one conductive track and the metal plate.

2. Arrangement in accordance with claim 1, wherein the metal plate is connected directly to a fixed potential through a conductive connection.

3. Arrangement in accordance with claim 2, wherein the fixed potential is a reference potential.

4. Arrangement in accordance with claim 2, wherein the fixed potential is a supply potential of the circuit arrangement.

5. In accordance with claim 2, wherein the fixed potential is a fixed potential present in the circuit arrangement.

6. Arrangement in accordance with claim 1, wherein the printed circuit board is arranged in a plastic housing and the metal plate is in contact with a metal pin that has been injection-molded in the plastic housing.

7. Arrangement in accordance with claim 6, wherein the metal pin is directly connected to a fixed potential.

8. Arrangement in accordance with claim 6, wherein a second spark gap is provided between the metal pin and the fixed potential.

9. Arrangement in accordance with claim 1, wherein the track to be protected represents a feed to a connector pin on a connector.

10. Arrangement in accordance with claim 1, wherein a breakdown voltage between the track and the metal plate is determined by the thickness of the insulating layer.

11. Arrangement in accordance with claim 1, wherein a solder stop lacquer coating is provided between the printed circuit board and the insulating layer.

12. Arrangement in accordance with claim 1, wherein: a plurality of said conductive tracks extend above said opening; and, the spacing between adjacent ones of the tracks above the opening is at least four times more than the spacing between adjacent ones of the conductive tracks in other regions of the surface.

* * * * *